United States Patent [19]

Duffield

[11] Patent Number: 5,451,953
[45] Date of Patent: Sep. 19, 1995

[54] PROGRAMMABLE REMOTE CONTROL UNIT WITHOUT EXTRA KEY FOR CONFIGURATION

[75] Inventor: David J. Duffield, Indianapolis, Ind.

[73] Assignee: Thomson Consumer Electronics, Inc., Indianapolis, Ind.

[21] Appl. No.: 13,035

[22] Filed: Feb. 3, 1993

[51] Int. Cl.[6] ............................................. G08C 19/12
[52] U.S. Cl. ............................... 341/176; 340/825.69; 340/825.72; 348/734
[58] Field of Search ...................... 358/194.1; 341/173, 341/176; 340/825.69, 825.72; 359/142, 145, 146, 148; 348/734

[56] References Cited

U.S. PATENT DOCUMENTS

| | | | |
|---|---|---|---|
| 4,482,947 | 11/1984 | Zato et al. | 358/194.1 X |
| 4,746,919 | 5/1988 | Reitmeier | 358/194.1 X |
| 4,774,511 | 9/1988 | Rumbolt et al. | 358/194.1 X |
| 4,825,200 | 4/1989 | Evans et al. | 340/825.72 X |
| 4,866,434 | 9/1989 | Keenan | 341/176 X |
| 4,999,622 | 3/1991 | Amano et al. | 341/176 X |

FOREIGN PATENT DOCUMENTS 0166297  7/1986  Japan ..................... 341/176

Primary Examiner—Brent Swarthout
Assistant Examiner—Thomas J. Mullen, Jr.
Attorney, Agent, or Firm—Joseph S. Tripoli; Peter M. Emanuel; Thomas F. Lenihan

[57] ABSTRACT

In a preprogrammed remote control unit, a controller is coupled to first and second pluralities of keys for determining which of the keys is depressed at any given time. The first and second pluralities of keys are coupled to the controller in an arrangement in which a key pressed in the first plurality of keys does not interfere with the reading of a key pressed concurrently in the second plurality of keys. A key identifying the device to be programmed is located in the first plurality of keys, and the numbered keys are located in the second plurality of keys. A selection of preprogrammed device control codes for a particular device to be controlled is made by holding down a key corresponding to the device to be controlled while concurrently entering the number of the desired selection via the numbered keys. In one embodiment of the invention no drive or sense line is shared between the number keys and the device selection keys. In a second embodiment of the invention, a drive line may be shared between the number keys and the device selection keys, but no sense line may be shared.

4 Claims, 2 Drawing Sheets

PROGRAMMABLE REMOTE CONTROL UNIT WITHOUT EXTRA KEY FOR CONFIGURATION

FIELD OF THE INVENTION

This invention concerns remote control units having preprogrammed control codes for controlling external equipment.

BACKGROUND OF THE INVENTION

Remote control units which are preprogrammed with control codes for controlling various pieces of equipment from different manufacturers are now quite common. The user must somehow select the proper control codes for controlling his particular equipment. One way to perform this selection is to set a code into an arrangement of switches (e.g., usually a dual in-line package of switches, commonly called DIP switches, mounted in a panel on the back of the remote control unit). Although this procedure is effective, the DIP switches are unsightly, and tend to be somewhat difficult to use for nontechnical people. Another common approach is to use the number keys on the remote control keyboard to perform the selection. In such an arrangement, a separate programming key is used to change the function of the number keys from a first mode in which pressing a number key causes a transmission of a code corresponding to that number, to a second mode in which pressing a number key selects a particular set of control codes. It is felt that adding an extra key to a remote control unit is an undesirable solution because remote control units already include numerous keys for a multitude of functions.

SUMMARY OF THE INVENTION

In a preprogrammed remote control unit, a controller is coupled to first and second pluralities of keys for determining which of the keys is depressed at any given time. The first and second pluralities of keys are coupled to the controller in an arrangement in which a key pressed in the first plurality of keys does not interfere with the reading of a key pressed concurrently in the second plurality of keys. A key identifying the device to be programmed is located in the first plurality of keys, and the numbered keys are located in the second plurality of keys. A selection of preprogrammed device control codes for a particular device to be controlled is made by holding down a key corresponding to the device to be controlled while concurrently entering the number of the desired selection via the numbered keys. In one embodiment of the invention no drive or sense line is shared between the number keys and the device selection keys. in a second embodiment of the invention, a drive line may be shared between the number keys and the device selection keys, but no sense line may be shared.

DETAILED DESCRIPTION OF THE DRAWING

Figure 1:
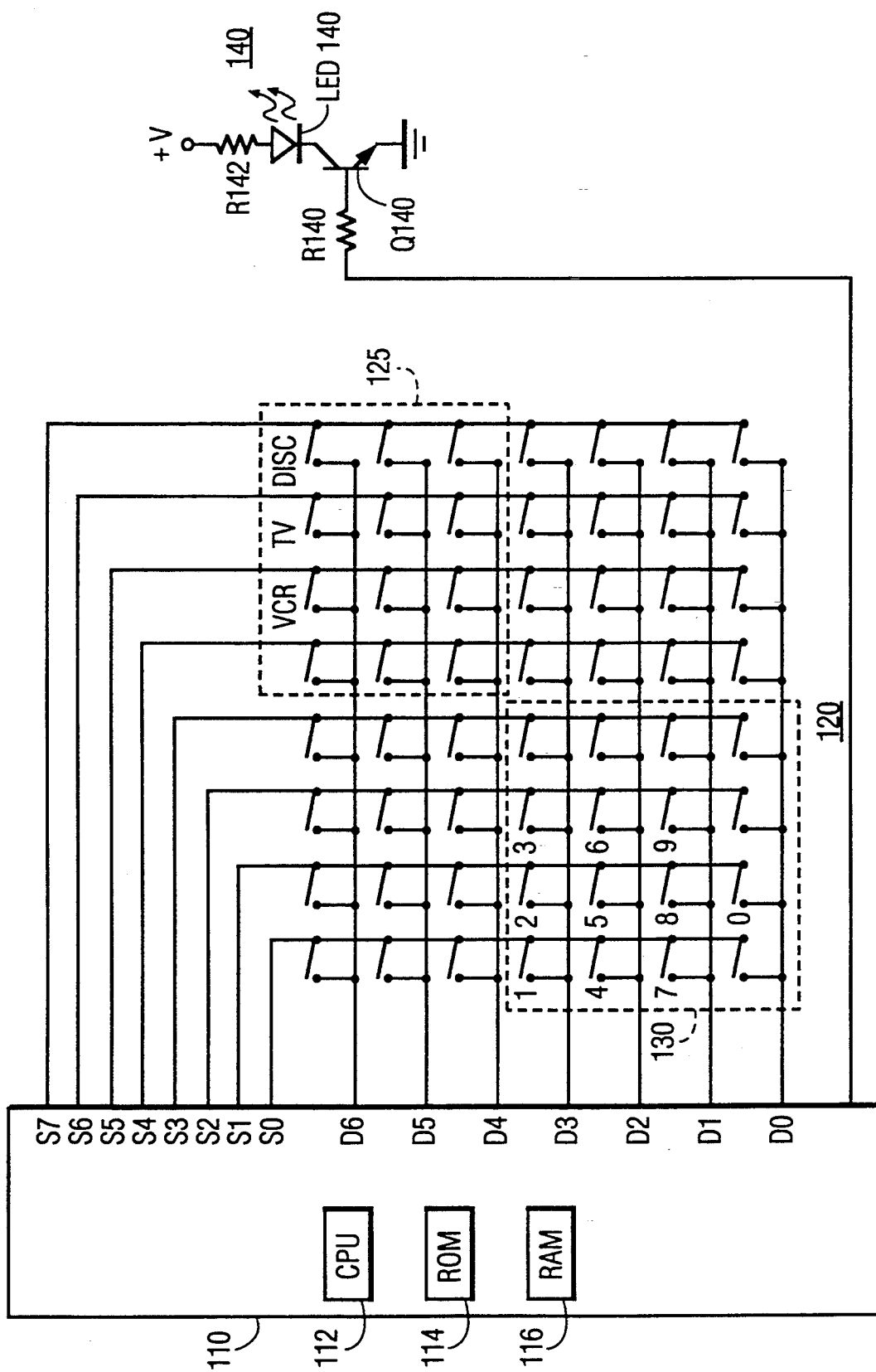
FIG. 1 is an illustration of a remote control unit having a keyboard arranged in accordance with a first embodiment of the invention.

Referring to FIG. 1, a remote control unit includes a microcomputer 110 for reading inputs of a keyboard, generally designated 120, and applying signals to be transmitted to an infrared (IR) LED transmitter arrangement, generally designated 140. The terms "microcomputer", controller, and "microprocessor", as used herein, are equivalent. It is also recognized that the control function of microcomputer 110 may be performed by an integrated circuit especially manufactured for that specific purpose (i.e., a "custom chip"), and the term "controller", as used herein, is also intended to include such a device. Microcomputer 110 receives user-initiated commands from keyboard 120 which is mounted on the remote control unit. Microcomputer 110 includes a central processing unit (CPU) 112, a program memory (ROM) 114, and includes a random-access memory (RAM) 116. ROM 114 may be either internal to, or external to, microprocessor 110, and also contains preprogrammed control codes for various equipment of different manufacturers. Ram 116 is used to store the entered number which identifies the particular set of control codes selected for each device to be controlled. Such a remote control unit is commonly referred to as a "universal" remote control unit. IR LED transmitter arrangement 140, includes an IR LED designated LED 140, a driver transistor Q140, and current-limiting resistors R140 and R142.

Keyboard 120 includes, for example, fifty-six keys, and has seven drive (i.e., input) lines coupled to controller 110 at output ports D0 through D6, and eight sense (i.e., output) lines coupled to controller 110 at input ports S0 through S7. In operation, keyboard 120 is scanned by applying a high level (i.e., logic level 1) signal to each of drive lines D0 through D6, in turn. After the high level signal is moved from one drive line to another, each of sense lines S0 through S7 is read to see if a high level signal is present. If so, then one of the keys of keyboard 120 must be pressed, completing a circuit from the active drive line to the active sense line. Controller 110 can easily determine which key is down because each key affects a unique drive line/sense line pair.

Typical keyboard-scanning software is written such that multiple, concurrent key closures are not permitted, because interpreting which key is desired under such conditions is ambiguous. Consider an example in which keys 1 and 3 are pressed concurrently. When drive line D3 assumes an active high logic level, a high level signal will be applied to sense line S0 through the closed contacts of switch 1, and a high level signal will be applied to sense line S2 through the closed contacts of switch 3. In order to avoid the ambiguity between reading a numeral 1 and a numeral 3, the software would accept only the input from the first active sense line encountered, S0. In so doing, the numeral 1 is entered, the pressing of key 3 is ignored, and the ambiguity is resolved.

In the subject invention, the number keys 0 through 9 are grouped within dotted box 130. A second dotted box 125 encompasses keys for specifying which piece of equipment is to be controlled, such as VCR, TV, and DISC (i.e., videodisc). Note that none of the keys in dotted box 130 shares any drive or sense line with any key of dotted box 125. This arrangement is important to the invention in that certain keys can be concurrently pressed without interfering with each other, so that the VCR key, for example, can be held down, while number keys are concurrently pressed to select a particular one of the preprogrammed codes for controlling the VCR.

The usual function of the device key (e.g., VCR) is to cause the transmission of a power-on command to the device. The usual function of each of the number keys is to cause the transmission of a signal representing that number to the device. In the subject invention, however, when a user holds down the key corresponding to a particular device to be controlled and concurrently enters a number, or pair of numbers, the continuous retransmission of the power-on command to the device is aborted, the transmission of the numbers to the device is prevented, and a totally different function is performed. That function is to use the entered numbers to access a portion of preprogrammed memory and thereafter to associate a particular set of codes with the device to be controlled. Note that in the prior art, a separate PROGRAM key had to be pressed in order to disable the transmission function of the keys and enable the program-code selection function. Thus, the subject invention has eliminated the need for a separate PROGRAM key.

Figure 2:
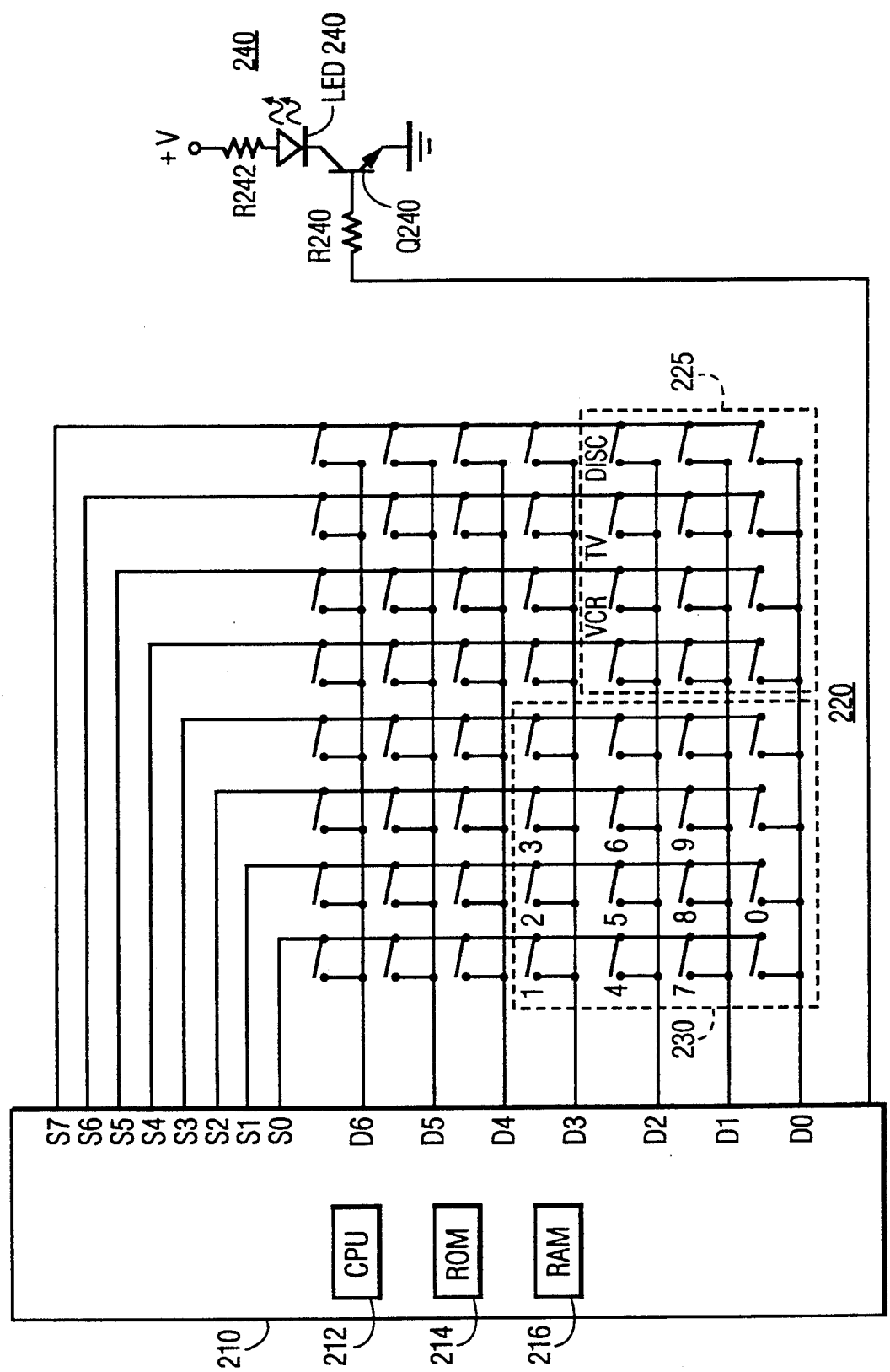
FIG. 2 is an illustration of a remote control unit having a keyboard arranged in accordance with a second embodiment of the invention.

FIG. 2 shows an embodiment of the invention in which a drive line D2 is shared between the number keys and the device selection keys, but no sense line is shared. Elements of FIG. 2 having similar reference numbers to elements of FIG. 1 have similar functions and need not be described again. In this embodiment when each of drive lines D0 through D6 is active, all of sense lines S0 through S7 are checked for a high level.

Although an IR remote control is shown in the embodiments of FIGS. 1 and 2, one skilled in the art should be aware that the invention is also applicable to remote control units which transmit radio frequency (RF) signals, and such remote control units are deemed to be within the scope of the invention.

What is claimed is:

1. A universal remote control unit, comprising:
   keyboard means including keys for entering data, said keys for entering data including keys for selecting one of a plurality of devices to be controlled, and keys for entering numbers;
   transmitting means for transmitting signals to said selected device to be controlled; and
   control means coupled to said keyboard means for receiving data entered by a user, and coupled to said transmitting means for applying thereto signals to be transmitted;
   memory means coupled to said control means for storing codes for controlling each of said plurality of devices;
   said control means accessing a particular area of said memory means containing a set of codes for controlling said selected device to be controlled in response to a number entered by a user in a programming mode of operation;
   said keyboard means being arranged such that concurrent operation of a device selection key and a number key does not interfere with coupling data from either key to said control means;
   said programming mode of operation being entered into in response to one of said keys for selecting a device to be controlled, and one of said keys for entering numbers concurrently being in an active state.

2. The universal remote control unit of claim 1, wherein: said transmitting means is an infrared (IR) light emitting diode (LED).

3. A remote control unit for controlling a plurality of devices of different manufactures, comprising:
   keyboard means including keys for entering data, said keys for entering data including keys for selecting one of a plurality of devices to be controlled, and keys for entering numbers:
   said keyboard means being arranged such that one of a plurality of rows of drive lines is coupled to one of a plurality of columns of sense lines by a switch coupled to one of said keys for entering data;
   control means coupled to said keyboard means for receiving said data from said keyboard means;
   transmitting means coupled to said control means for transmitting signals to said selected device to be controlled; and
   memory means coupled to said control means, and preprogrammed with control codes for controlling each of said plurality of devices;
   said control means operating in a first mode for receiving said data from said keyboard means and applying corresponding signals to be transmitted to said transmitting means, and operating in a second mode in which said control means accesses a particular area of said memory means containing a set of codes for controlling said selected device to be controlled in response to a number entered by a user;
   said keys of said keyboard means being grouped such that no number key has one of said drive or sense lines in common with any device selection key;
   said second mode of operation being entered into when one of said keys for selecting a device to be controlled and one of said keys for entering numbers are concurrently in an active state.

4. A remote control unit for controlling a plurality of devices of different manufactures, comprising:
   keyboard means including keys for entering data, said keys for entering data including keys for selecting one of a plurality of devices to be controlled, and keys for entering numbers:
   said keyboard means being arranged such that one of a plurality of rows of drive lines is coupled to one of a plurality of columns of sense lines by a switch coupled to one of said keys for entering data;
   control means coupled to said keyboard means for receiving said data from said keyboard means;
   transmitting means coupled to said control means for transmitting signals to said selected device to be controlled; and
   memory means coupled to said control means, and preprogrammed with control codes for controlling each of said plurality of devices;
   said control means operating in a first mode for receiving said data from said keyboard means and applying corresponding signals to be transmitted to said transmitting means, and operating in a second mode in which said control means accesses a particular area of said memory means containing a set of codes for controlling said selected device to be controlled in response to a number entered by a user;
   said keys of said keyboard means being grouped such that no number key has one of said sense lines in common with any device selection key;
   said second mode of operation being entered into when one of said keys for selecting a device to be controlled and one of said keys for entering numbers are concurrently in an active state.

* * * * *